United States Patent
Whittaker et al.

(10) Patent No.: US 6,483,345 B1
(45) Date of Patent: Nov. 19, 2002

(54) HIGH SPEED LEVEL SHIFT CIRCUIT FOR LOW VOLTAGE OUTPUT

(75) Inventors: Edward J Whittaker, Bishop's Stortford; Imran Sherazi, Grays, both of (GB)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/338,692

(22) Filed: Jun. 23, 1999

(51) Int. Cl.[7] .......................................... H03K 19/0125
(52) U.S. Cl. ............................ 326/62; 326/67; 326/78; 326/80; 326/127
(58) Field of Search ........................ 326/62, 127, 78, 326/130, 67, 80

(56) References Cited

U.S. PATENT DOCUMENTS

| | | | |
|---|---|---|---|
| 4,045,690 A | 8/1977 | Tam | 307/260 |
| 4,329,597 A * | 5/1982 | Yamagiwa | 326/32 |
| 4,939,393 A | 7/1990 | Petty | 307/475 |
| 5,025,180 A | 6/1991 | Kim et al. | 307/475 |
| 5,107,145 A * | 4/1992 | Kurashima | 326/127 |
| 5,349,253 A * | 9/1994 | Ngo et al. | 326/77 |
| 5,448,183 A * | 9/1995 | Koreeda | 326/33 |
| 5,502,405 A * | 3/1996 | Williams | 326/66 |
| 5,883,910 A | 3/1999 | Link | |
| RE36,560 E * | 2/2000 | Svetkoff et al. | 356/376 |
| 6,114,874 A * | 9/2000 | Bales | 326/66 |

FOREIGN PATENT DOCUMENTS

EP 0 317 144 5/1989

OTHER PUBLICATIONS

Patent Abstracts of Japan vol. 1997: Publication No. 09200037, Publication Date Jul. 31, 1997.

* cited by examiner

Primary Examiner—Michael G. Lee
Assistant Examiner—Steven S. Paik
(74) Attorney, Agent, or Firm—Lee, Mann, Smith, McWilliams, Sweeney & Ohlson

(57) ABSTRACT

An interface circuit from Common Mode Logic to a low voltage, fixed common mode output, with high current drive. The CML signal is received, and then re-referenced to a low-voltage band-gap supply. The circuit is arranged to provide an output data signal referenced to a second positive reference voltage supply responsive to receipt of a common mode input data signal referenced to a first positive reference voltage supply. The circuit avoids use of vertical PNP transistors in the signal path.

16 Claims, 3 Drawing Sheets

HIGH SPEED LEVEL SHIFT CIRCUIT FOR LOW VOLTAGE OUTPUT

FIELD OF THE INVENTION

The present invention relates to a method and apparatus for high speed level shifting to provide a low voltage output, and a system incorporating the same.

BACKGROUND TO THE INVENTION

Logic signals at very high speed are often processed using bipolar Current Mode Logic (CML)—a signalling system involving small voltage swings (typically 250 mV) referenced to the positive supply of the integrated circuit (IC). Output interface levels from an IC using this logic are generally specified with a greater signal swing than 250 mV.

For a bipolar transistor to operate at speed it is necessary that its collector base junction does not enter forward conduction. Therefore, in order to allow increased signal swing on the output stage, the logic signals which drive it have to be level shifted from the positive rail reference down to a lower voltage. The more the signal can be shifted the greater the potential output swing.

Known attempts to level shift very high speed logic signals from a positive power rail reference down to a level as close as possible to a ground or negative rail, however, have encountered a number of problems.

Use of complementary vertical PNP transistors in the signal path slowed the signal since PNP's are inherently slower than NPN's. Their use also added considerably to the complexity of the semiconductor process since extra process steps were required in their fabrication.

Use of NPN diode level shifters was also considered. However this approach did not take account of power supply variation and required circuit complexity to allow for the temperature variation of the forward voltage drop of the diode junction. Tolerancing these circuits over temperature and power rail variation was therefore difficult since, in general, complexity in the signal path leads to slow circuits.

OBJECT OF THE INVENTION

The present invention seeks to provide an improved method and apparatus for high speed level shifting for low voltage output.

SUMMARY OF THE INVENTION

According to a first aspect of the present invention there is provided an electronic circuit arranged to receive a common mode input data signal referenced to a first positive reference voltage supply and to provide an intermediate data signal referenced to a second positive reference voltage supply, wherein said second reference voltage is lower than said first reference voltage.

Preferably, all transistors through which data signals pass between said input data signal and said intermediate data signal are NPN transistors.

Advantageously, level shifting of very high speed logic signals from the positive power rail reference down to a level as close as possible to the ground power rail without use of vertical PNP transistors in the signal path avoids slowing the signal since PNP's are inherently slower than NPN's, and avoids adding considerable complexity of the semiconductor fabrication process that would arise from additional steps required to form vertical PNP's.

Advantageously, signals referenced to the ground rail may be used to drive a very fast long tailed pair output stage with minimal loss of voltage headroom and hence best efficiency.

Advantageously, the present invention maximises the drive capability of such a high speed output signal without invoking any additional power rails or any special process steps in the fabrication of the IC.

Advantageously, the circuit may operate from a single external power supply.

Preferably said input data signal, and intermediate data signal are common mode logic signals.

Preferably said first and second voltages are both positive.

Advantageously this does not require provisioning of a negative power rail which would be expensive, require more power, and impose greater voltage stress on the integrated chip.

Preferably the maximum voltage of said intermediate signal does not exceed said second reference voltage.

Preferably said second reference voltage is maintained within lower tolerances than said first reference voltage.

Preferably said second reference voltage is provided from a band gap supply.

Advantageously, the circuit takes account of power supply variation and overcomes the problems associated with temperature variation of the forward voltage dcp associated with use of diode junction: tolerancing these circuits over temperature and power rail variation is more straightforward since the circuitry involved is simpler.

In a preferred embodiment, said first circuit comprises a first and second input circuits, a sensing element, and a current mirror circuit.

In a preferred embodiment the circuit additionally comprises a second circuit arranged to regenerate said intermediate data signal whereby to provide an output data signal.

Preferably, said second circuit comprises a long-tailed pair.

The arrangement may also comprise a third circuit arranged to provide a second output data signal referenced to said second reference voltage supply and having high current drive.

Preferably said high current drive is drawn from said first reference voltage supply.

Preferably said third circuit comprises a feedback circuit, whereby to maintain said second output data signal within tolerances.

The arrangement may also comprise a laser modulator circuit arranged to provide an optical output data signal responsive to receipt of said output data signal.

According to a second aspect of the present invention there is provided a laser modulator package assembly comprising an electronic circuit arrangement according to the first aspect of the present invention.

Preferably said electronic circuit arrangement comprises a laser modulator circuit arranged to provide an optical output data signal responsive to receipt of said output data signal.

According to a third aspect of the present invention there is provided an optical transmitter circuit board comprising a laser modulator package.

According to a fourth aspect of the present invention there is provided a telecommunications system comprising an electronic circuit arrangement.

The invention also provides for a system for the purposes of digital signal processing which comprises one or more instances of apparatus embodying the present invention, together with other additional apparatus.

The invention is also directed to a method by which the described apparatus operates and including method steps for carrying out every function of the apparatus.

In particular, according to a fifth aspect of the present invention there is provided a method of level shifting an input data signal comprising the stages of providing said input data signal referenced to a first positive reference voltage supply, generating an intermediate data signal referenced to a second positive reference supply responsive to receipt of said input data signal, wherein said second reference voltage is lower than said first reference voltage.

In a preferred embodiment, the method additionally comprises the steps of generating an output data signal with high current drive and referenced to said second positive reference voltage supply with high current drive responsive to receipt of said intermediate data signal, In a further preferred embodiment, the method additionally comprises the steps of providing an optical output data signal responsive to receipt of said intermediate data signal.

The preferred features may be combined as appropriate, as would be apparent to a skilled person, and may be combined with any of the aspects of the invention.

BRIEF DESCRIPTION OF THE DRAWINGS

In order to show how the invention may be carried into effect, embodiments of the invention are now described below by way of example only and with reference to the accompanying figures in which.

DETAILED DESCRIPTION OF INVENTION

Figure 1:
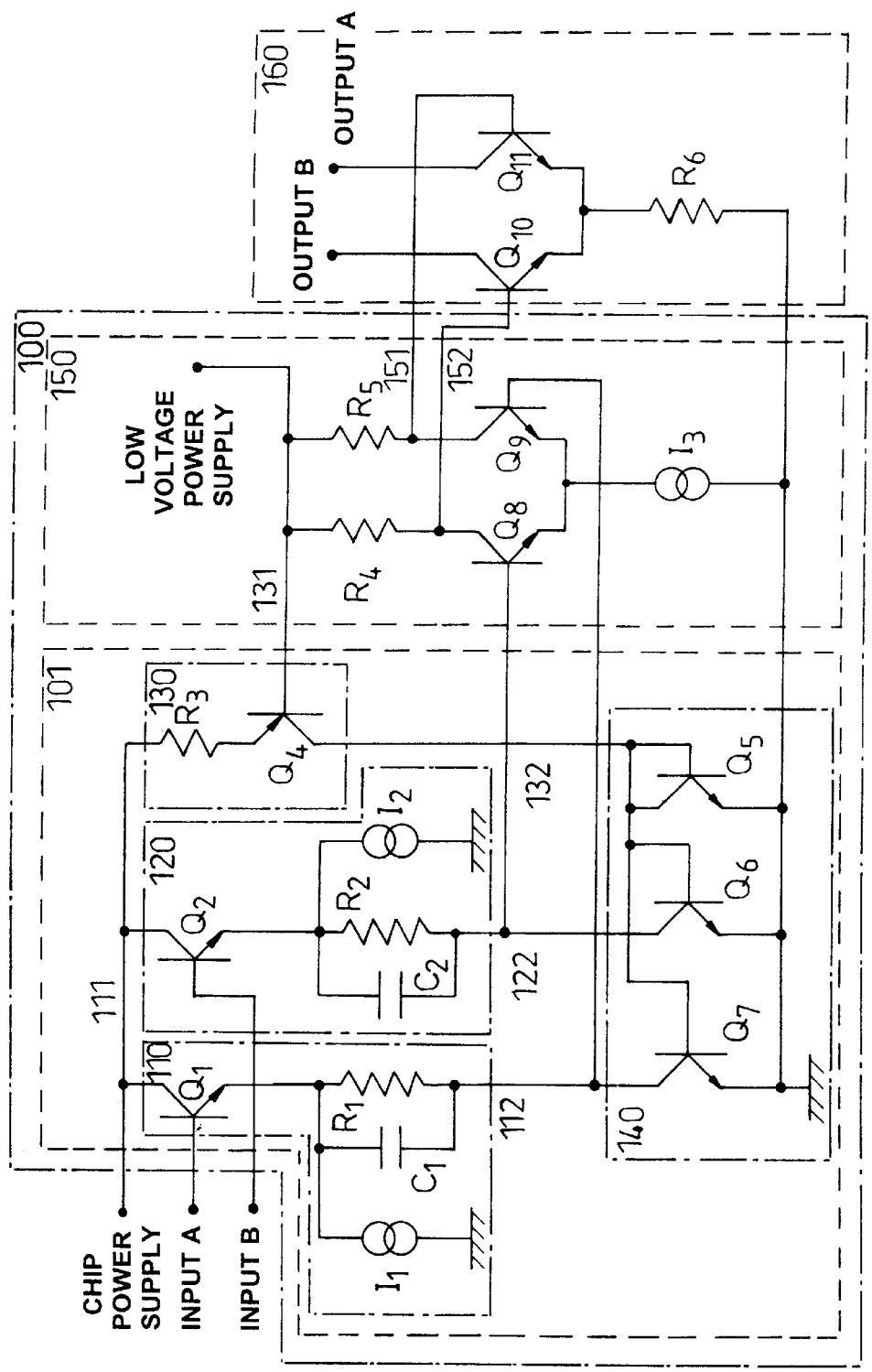
FIG. 1 shows a first circuit in accordance with the present invention.

Referring first to FIG. 1, there is shown a first embodiment of a high-speed level shift circuit for low voltage output.

The high speed level shift circuit 100 comprises a re-referencing stage 101 and a regenerating buffer stage 150. In the arrangement shown, the level shift circuit is coupled to an output stage 160.

The re-referencing stage 101 comprises first and second input stages 110, 120, sensing element 130, and current mirror 140.

Input stage 110 comprises a connection to the chip power rail 111 (typically 3.3V±0.3) and a data signal input INPUTA and a signal output 112. It comprises a NPN transistor Q1, resistor R1 capacitor C1, and current source I1. The base connection of Q1 is connected to the data input INPUTA; the collector of Q1 is connected to the chip power rail 111. Resistor R1 is connected in series between the emitter of Q1 and the output port 112. Capacitor C1 is connected in parallel across resistor R1. Current source I1 is connected to the emitter of Q1.

Input stage 120 is similarly configured with corresponding elements Q2, R2, C2, and I2.

Turning now to the sensing element 130, this comprises a resistor R3 and PNP transistor Q4, resistor R3 being connected in series between the chip power rail 111 and the emitter of Q4. The base of Q4 is connected to low voltage power rail 131 whilst the collector of Q4 is connected to the current mirror 140 via connection 132. Q4 may be a lateral PNP transistor.

The current mirror 140 comprises three NPN transistors Q5, Q6, and Q7. The base of each of these transistors is connected to output 132 of the sensing circuit 130 as is the collector of transistor Q5. Collectors of Q6, Q7 are connected to outputs 122, 112 of input stages 120, 110 respectively. Emitters of each of the three transistors are connected to ground.

The regenerating buffer stage 150 comprises a long-tailed pair comprising two resistors R4, R5, two NPN transistors Q8, Q9, and a current supply I3. The base of Q8 is connected to the output 122 of input stage 120 and correspondingly the base of Q9 is connected to output 112 of input stage 110. The collector of Q8 is connected via resistor R4 to the low voltage power rail 131; similarly the collector of Q9 is connected via resistor R5 to the low voltage power rail 131. The emitters of both Q8 and Q9 are connected via current supply R3 to ground. Two output ports are provided 151, 152 connected to the collector of Q9 and Q8 respectively.

The output stage 160 comprises a pair of NPN transistors Q10 and Q11 and resistor R6. The bases of Q10, Q11 are connected to ports 152, 151 respectively whilst the emitters are connected via resistor R6 to ground. The collectors of Q11, Q10 are connected to output ports OUTPUTA, OUTPUTB respectively.

The regenerating buffer stage 150 is used to set the minimum voltage required for the output stage 160 to operate and also sets the voltage across resistor R6.

Output stage 160 is used to set the voltage and power levels at the two outputs OUTPUTA and OUTPUTB.

In operation, an input signal is provided on pins INPUTA and INPUTB. This signal is typically a differential Current Mode Logic (CML) signal with a swing of about 250 mV with respect to the positive supply rail. This drives emitter followers Q1 and Q2 which are biased via the two current sources 11 and 12. The emitters drive two resistors, R1 and R2, the DC voltage drops across which are set by the current flowing through the mirror transistors Q5, Q6. The purpose of this voltage drop is to match the signal from the emitter followers into the long tailed pair formed by Q8 and Q9. Capacitors C1 and C2 give a high frequency path past R1 and R2 to overcome the capacitive loading imposed by Q8 and Q9. The voltage swing on the collectors of Q8 and Q9 is restricted to about 250 mV and with the feed from Q1 and Q2 both are fully switched. In order to prevent the saturation of Q8 or Q9 the drive to the bases should not exceed the positive power rail for Q8 and Q9. This will still reverse the collector base junctions of Q8 or Q9 by 250 mV but this does not substantially impinge on operating speed and is the normal operating condition for CML circuits anyway. Examining the circuit it is apparent that the required current, $I_{dc}$ through R1 and R2 is given by:

$$I_{dc} = \frac{(V_{pos1} - V_{pos2}) - V_{be}}{R1} \quad (1)$$

where $V_{be}$, is the forward emitter base voltage of Q1 or Q2 $V_{pos1}$ is the power rail 111 supply voltage, and $V_{pos2}$ is the low voltage power rail 131 supply voltage.

The requirements on the drive to Q8 and Q9 are not particularly stringent. A match to within 50 mV of the ideal is sufficient and to a first approximation a PNP forward voltage drop may be matched to a NPN drop (i.e. with appropriate geometries the magnitude of their $V_{be}$'s may be considered the same for a given operating current). A low speed circuit formed by the slow lateral PNP transistor, Q4, and the resistor R3 senses the difference in the potential $((V_{pos1}-V_{pos2})-V_{be})$. In the case where R1=R2=R3 the low speed circuit sets up a current in the collector of Q4, exactly matching the required current in R1 and R2. It is then a simple matter of mirroring this current via Q5, Q6, and Q7 in order to set up the correct conditions on the bases of Q8 and Q9.

In some applications it may be advantageous to add further circuitry to allow for the finite gain of the transistors and the effects of base width modulation with collector voltage (Early effect). Such techniques are well known in the art.

The drive requirements to the bases of Q10 and Q11 dictate the choice of $V_{pos2}$. It is apparent from FIG. 1 that $V_{pos2}$ programs the current steered by Q10 and Q11. In the case where the base current drawn by Q10 and Q11 makes minimal impact on the voltage on Q8 and Q9 collectors respectively, the voltage, V6, across R6 is given by equation (2).

$$V6 = V_{pos2} - V_{be} \qquad (2)$$

where $V_{be}$ is the voltage between base and emitter of transistor Q10 or Q1.

The current, I, out through Q10 and Q11 collectors is given by equation (3).

$$I = (V_{pos2} - V_{be})/R6 \qquad (3)$$

It is clearly possible to vary the current output by changing $V_{pos2}$. By assigning an appropriate temperature dependence to $V_{pos2}$, the current, I, may be made to have any required temperature characteristic.

The output voltage of Q10 and Q11 may safely swing down to a minimum, $V_{min}$, given in equation (4).

$$V_{min} = (V_{pos2} - V_{be}) + V_{sat} \qquad (4)$$

where $V_{sat}$ is the minimum collector emitter voltage of Q10 and Q11 below which the transistors saturate and performance is degraded.

In summary, the re-referencing circuit 101 is arranged to receive a pair of common mode logic signals on its data inputs INPUTA, INPUTB referenced to the positive power rail 111 and re-references these inputs to a second reference voltage $V_{pos2}$. In addition, by virtue of its connection via Q4 to the low voltage bandgap supply, the circuit ensures that the voltage of the output signals is normally less than that of the low-voltage supply 131. This ensures that the intermediate output signals at 112, 122 have a constant common mode referenced to the ground rail and lower than the bandgap supply voltage, $V_{pos2}$ on rail 131.

The regenerating buffer circuit 150 is arranged to regenerate the intermediate output signals provided by the initial re-referencing circuit 101, re-referenced to the low voltage bandgap supply, $V_{pos2}$, and ensures that the maximum voltage of the output signals does not exceed that of the low-voltage supply.

Figure 2:
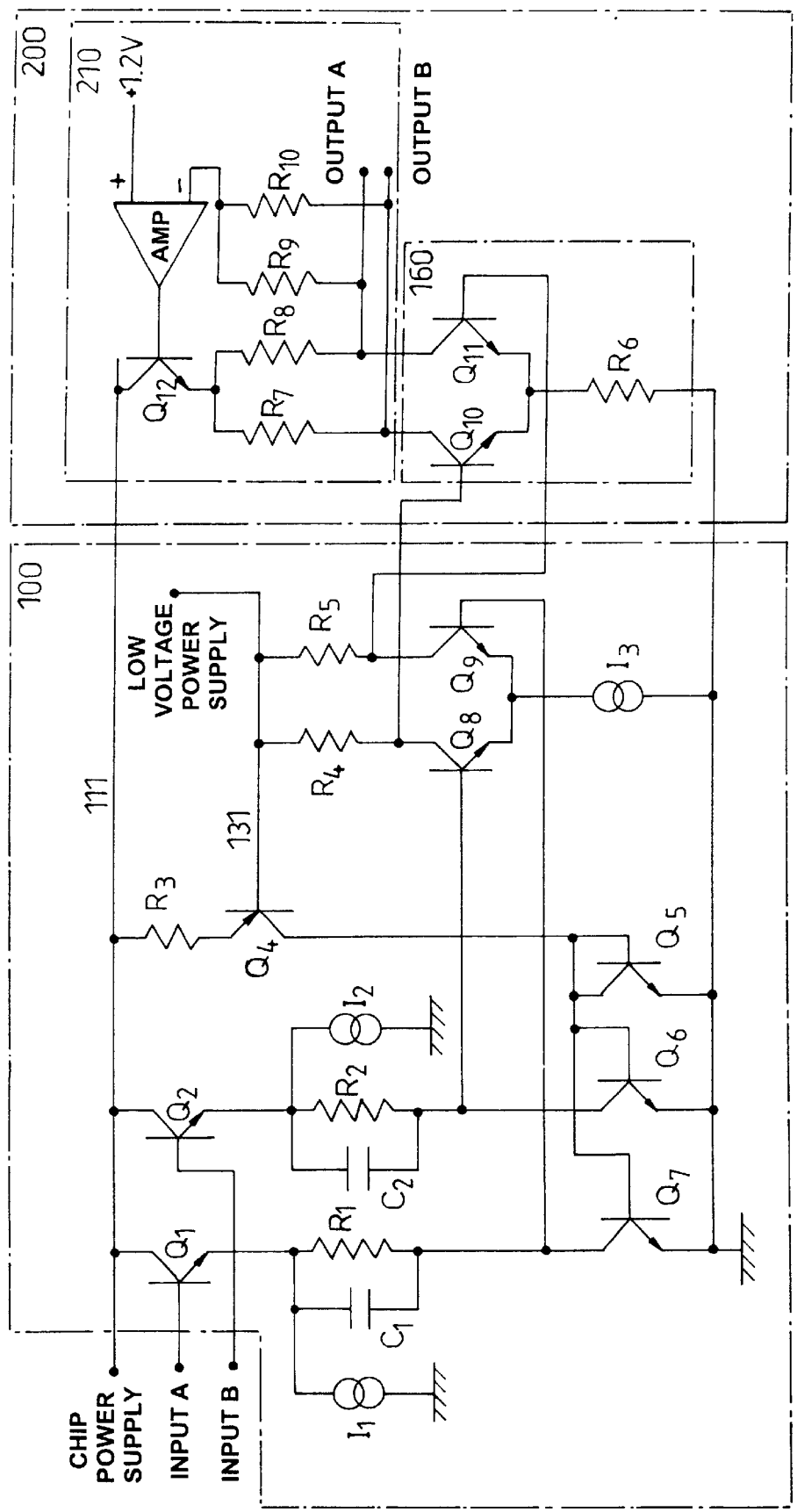
FIG. 2 shows a second circuit in accordance with the present invention arranged to drive a Low Voltage Differential Signal (LVDS) buffer.

Referring now to FIG. 2, there is shown the design of an LVDS output driver, using the level shift circuit 100.

This circuit comprises an additional control loop 210, comprising four resistors R7–R10, amplifier AMP, and NPN transistor Q12. Resistors R9, R10 are connected in parallel from the inverting input of the amplifier AMP to data outputs OUTPUTA and OUTPUTB respectively of output stage 160. The non-inverting input of the amplifier is connected to a +1.2 V supply whilst its output is connected to the base of transistor Q12. The collector of transistor Q12 is connected to chip power rail $V_{pos1}$. Resistors R7, R8 are arranged in parallel to provide paths from the emitter of transistor Q12 to OUTPUTB and OUTPUTA respectively.

Control loop 210 stabilises the mean output voltage to 1.2 v as required by the LVDS specification. This is provided by sensing the mean voltage of the outputs with two high value resistors R9 and R10 (where R9, R10>>R7, R8) and comparing with a reference 1.2 V source in the amplifier, AMP which drives the emitter follower of Q12. $V_{pos2}$ is set such that the output swing on nodes OUTPUTA and OUTPUTB is 300 mV (in the middle of the specification for output swing) when loaded with an external 100 ohm load.

If the current drawn by the bases of Q10, Q11 should increase such that appreciable drops across R4, R5 would result then it is possible to increase $V_{pos2}$ by one $V_{be}$ and use NPN emitter followers on the output of Q8/Q9 collectors to overcome this problem.

When driving a laser diode it is normal to have standing DC current which sets the diode at its threshold, and an additional superposed pulse modulation. The amplitude of both these components varies widely from diode to diode—even of the same type and so these have to be programmed for each diode.

Figure 3:
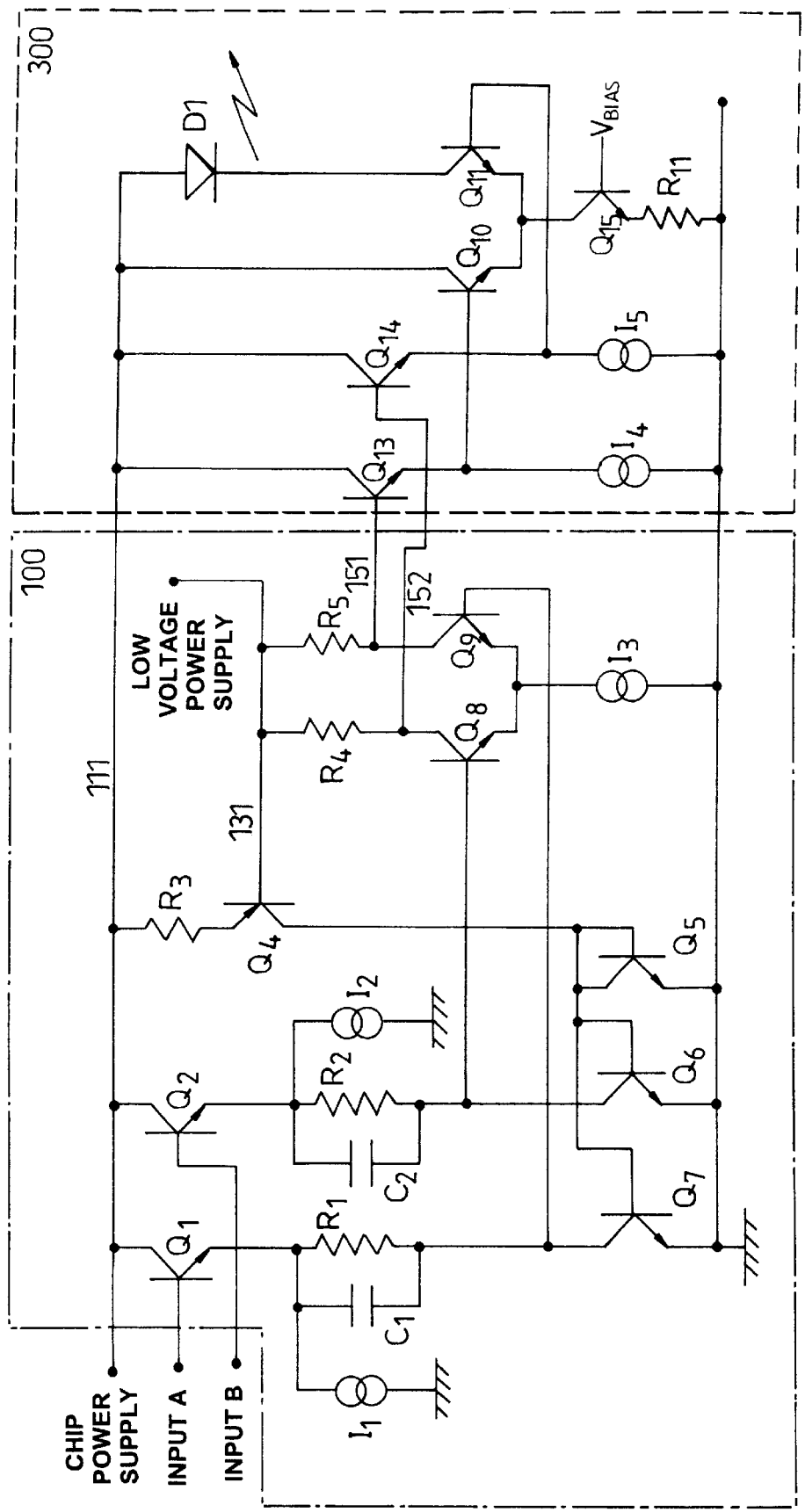
FIG. 3 shows a second circuit in accordance with the present invention arranged to drive a laser modulator.

FIG. 3 shows the design of a pulse modulator for a laser diode D1 driven from a 3.3V supply ($V_{pos1}$) with variable modulation current. The arrangement comprises a high speed level shift circuit 100 and a laser diode output stage 300.

The laser diode output stage comprises a laser diode D1, five NPN transistors Q10–Q11, Q13–15 resistor R11, and two current sources 14, 15.

The bases of Q13, Q14 are coupled to data outputs 151, 152 respectively; collectors of Q13, Q14 are coupled to the chip power rail 111; and emitters coupled to ground via power supplies 14,15 respectively.

The bases of Q10, Q11 are coupled to the emitters of Q13, Q14 respectively; emitters of both Q10 and Q11 are coupled to the collector of Q12, the emitter of which is coupled via resistor R11 to ground.

The collector of Q10 is coupled to the chip power rail 111; the collector of Q11 which carries the regenerated input signal from INPUTA, is coupled to ground via laser diode D1.

In this arrangement emitter followers Q13, Q14 are placed between R4, R5 and Q10, Q11 respectively, as described above. This allows the driving of higher current laser diodes, but is not mandatory for more sensitive laser diodes. The current through the output stage in this arrangement is set by a programmable current source, comprising NPN transistor Q15 and resistor R11. The voltage $V_{BIAS}$ on Q15 base sets the output current and may be adjusted for each laser diode. The only performance penalty of this arrangement over that in FIG. 1 is the additional headroom needed to accommodate the current source. Effectively this is the saturation voltage, $V_{sat}$, of Q15.

This circuit arrangement facilitates collocation of the driver circuit with the laser diode itself in the same package. If the driver is mounted exceptionally close to the laser the electrical interface to the laser can be kept simple thereby saving power in the laser driver. This power saving is certainly necessary if they are to be collocated: lasers work best when cool. By saving power in the driver it is possible to mount the driver close to the laser without needing to use, for example, Peltier cooling devices to refrigerate the whole assembly.

The power saving comes about because of the avoidance of the difficulty of driving fast signals to a laser over any distance. The reason is the low impedance presented by the laser diode: typically a few ohms. To drive fast signals over any distance it is necessary to use a transmission line terminated in the natural impedance of the transmission line. Typically, the impedance of a transmission line is 50 ohms although lower impedances may be made (though not down to the impedance of the diode). The diode end of the transmission line has to match the line impedance. This is done by adding resistance in series with the diode to raise the resultant impedance to that of the line. This series resistor is where the power is wasted and the additional power has to come from the laser driver. Typically, commercial high speed test gear and cabling is built for 50 ohms, thus if laser and driver are to be supplied as separate modules this is very much the preferred impedance since users can hook the two together and/or evaluate them individually using standard equipment. The cabling, and special high frequency connectors would all add cost to the arrangement. The increased power required from the laser driver needs a separate integrated circuit, usually in the very expensive Gallium Arsenide process, since that is better suited than silicon to such an increased level of output. The additional electrical power has to be supplied to the laser system and the resultant increase in heat dissipated. And, of course, one module takes less space than two linked by cable with connectors on them.

Furthermore, purchasers of such apparatus would prefer to purchase off-the-shelf circuits arranged to accept standard logic signal in, and give optical signals out, rather that be left the task of coupling lasers to their drivers themselves.

Any range or device value given herein may be extended or altered without losing the effect sought, as will be apparent to the skilled person for an understanding of the teachings herein.

What is claimed is:

1. An electronic level shift circuit arranged to receive a common mode logic input data signal referenced to a first positive reference voltage supply and to provide a common mode logic intermediate data signal referenced to a second positive reference voltage supply, wherein said second reference voltage is lower than said first reference voltage,
   and comprising a control circuit arranged to control degree of level shift from the first referenced voltage supply responsive to the difference in voltage between the first and second reference voltage supplies.

2. The electronic circuit arrangement according to claim 1 wherein all transistors through which data signals pass between said input data signal and said intermediate data signal are NPN transistors.

3. The electronic circuit arrangement according to claim 1 wherein said first and second voltages are both positive.

4. The electronic circuit arrangement according to claim 1 wherein said second reference voltage is lower than said first reference voltage.

5. The electronic circuit arrangement according to claim 1 wherein said second reference voltage is maintained within lower tolerances than said first reference voltage.

6. The electronic circuit arrangement according to claim 1 comprising first and second input circuits, a sensing element, and a current mirror circuit.

7. The electronic circuit according to claim 1 additionally comprising:
   a second circuit arranged to regenerate said intermediate data signal whereby to provide an output data signal.

8. An electronic level shift circuit arranged to receive a common mode logic input data signal referenced to a first positive reference voltage supply and to provide a common mode logic intermediate data signal referenced to a second positive reference voltage supply, wherein said second reference voltage is lower than said first reference voltage,
   and comprising a control circuit arranged to control degree of level shift from the first referenced voltage supply responsive to the difference in voltage between the first and second reference voltage supplies
   wherein said second reference voltage is provided from a band gap supply.

9. An electronic level shift circuit arranged to receive a common mode logic input data signal referenced to a first positive reference voltage supply and to provide a common mode logic intermediate data signal referenced to a second positive reference voltage supply, wherein said second reference voltage is lower than said first reference voltage,
   and comprising a control circuit arranged to control degree of level shift from the first referenced voltage supply responsive to the difference in voltage between the first and second reference voltage supplies;
   a second circuit arranged to regenerate said intermediate data signal whereby to provide an output common mode logic data signal
   wherein said second circuit comprises a long-tailed pair.

10. An electronic level shift circuit arranged to receive a common mode logic input data signal referenced to a first positive reference voltage supply and to provide a common mode logic intermediate data signal referenced to a second positive reference voltage supply, wherein said second reference voltage is lower than said first reference voltage,
    and comprising a control circuit arranged to control degree of level shift from the first referenced voltage supply responsive to the difference in voltage between the first and second reference voltage supplies;
    additionally comprising:
    a third circuit arranged to provide a second output data signal referenced to said second reference voltage supply and having high current drive.

11. The electronic circuit arrangement according to claim 10 wherein said high current drive is drawn from said first reference voltage supply.

12. The electronic circuit arrangement according to claim 10 wherein said third circuit comprises:
    a feedback circuit, whereby to maintain said second output data signal within tolerances,
    a laser modulator circuit arranged to provide an optical data signal responsive to receipt of said output data signal.

13. An electronic level shift circuit arranged to receive a common mode logic input data signal referenced to a first positive reference voltage supply and to provide a common mode logic intermediate data signal referenced to a second positive reference voltage supply, wherein said second reference voltage is lower than said first reference voltage,
    and comprising a control circuit arranged to control degree of level shift from the first referenced voltage supply responsive to the difference in voltage between the first and second reference voltage supplies;
    a laser modulator circuit arranged to provide an optical output data signal responsive to receipt of said output data signal.

14. A method of level shifting a common mode logic input data signal comprising the stages of:
    providing said input data signal referenced to a first positive reference voltage supply;

generating a common mode logic intermediate data signal referenced to a second positive reference supply responsive to receipt of said input data signal;

wherein said second reference voltage is lower than said first reference voltage;

monitoring the difference in voltage between the first and second reference voltage supplies;

and controlling degree of level shift from the first reference voltage supply responsive to the monitoring.

15. A method of level shifting a common mode logic input data signal comprising the stages of:

providing said input data signal referenced to a first positive reference voltage supply;

generating a common mode logic intermediate data signal referenced to a second positive reference supply responsive to receipt of said input data signal;

wherein said second reference voltage is lower than said first reference voltage;

monitoring the difference in voltage between the first and second reference voltage supplies;

and controlling degree of level shift from the first reference voltage supply responsive to the monitoring;

generating an output data signal with high current drive and referenced to said second positive reference voltage supply responsive to receipt of said intermediate data signal.

16. A method of level shifting a common mode logic input data signal comprising the stages of:

providing said input data signal referenced to a first positive reference voltage supply;

generating a common mode logic intermediate data signal referenced to a second positive reference supply responsive to receipt of said input data signal;

wherein said second reference voltage is lower than said first reference voltage;

monitoring the difference in voltage between the first and second reference voltage supplies;

and controlling degree of level shift from the first reference voltage supply responsive to the monitoring;

providing an optical output data signal responsive to receipt of said output data signal.

* * * * *